United States Patent
Yang et al.

(10) Patent No.: US 12,414,458 B2
(45) Date of Patent: Sep. 9, 2025

(54) DISPLAY PANEL AND MANUFACTURING METHOD THEREOF

(71) Applicant: Wuhan China Star Optoelectronics Semiconductor Display Technology Co., Ltd., Hubei (CN)

(72) Inventors: Lin Yang, Hubei (CN); Xianjie Li, Hubei (CN); Jiajia Luo, Hubei (CN); Jinchang Huang, Hubei (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 987 days.

(21) Appl. No.: 17/254,879

(22) PCT Filed: Mar. 4, 2019

(86) PCT No.: PCT/CN2019/076829
§ 371 (c)(1),
(2) Date: Dec. 22, 2020

(87) PCT Pub. No.: WO2020/133682
PCT Pub. Date: Jul. 2, 2020

(65) Prior Publication Data
US 2021/0273200 A1 Sep. 2, 2021

(30) Foreign Application Priority Data
Dec. 24, 2018 (CN) .......................... 201811579228.5

(51) Int. Cl.
*H10K 77/10* (2023.01)
*H10K 50/844* (2023.01)
(Continued)

(52) U.S. Cl.
CPC ......... *H10K 77/111* (2023.02); *H10K 50/844* (2023.02); *H10K 59/873* (2023.02);
(Continued)

(58) Field of Classification Search
CPC ...... H10K 50/844; H10K 59/12; H10K 71/00; H10K 77/111; H10K 59/1201; H10K 59/873; Y02E 10/549
See application file for complete search history.

(56) References Cited

U.S. PATENT DOCUMENTS

| | | | |
|---|---|---|---|
| 6,212,057 B1* | 4/2001 | Kohara | H01G 4/08 361/306.3 |
| 2005/0145839 A1* | 7/2005 | Yamamoto | C08G 61/122 438/82 |

(Continued)

FOREIGN PATENT DOCUMENTS

| | | |
|---|---|---|
| CN | 102468452 | 5/2012 |
| CN | 103872069 | 6/2014 |

(Continued)

OTHER PUBLICATIONS

International Search Report and the Written Opinion Dated Sep. 24, 2019 From the International Searching Authority Re. Application No. PCT/CN2019/076829 and Its Translation of Search Report Into English. (9 Pages).

*Primary Examiner* — Yasser A Abdelaziez

(57) ABSTRACT

Provided is a display panel, comprising a flexible substrate, a transition layer, a buffer layer, a drive layer, a functional layer, and a thin-film encapsulation layer. The transition layer covers one side of the flexible substrate; the buffer layer covers one side, away from a rigid carrier, of the transition layer; the drive layer covers one side, away from the transition layer, of the buffer layer; the functional layer covers one side, away from the buffer layer, of the drive layer; and the thin-film encapsulation layer covers the surface of the functional layer. According to the invention, a sulfydryl-containing transition layer is modified on a flexible substrate by means of sulfydryl modification to realize tight adhesion between the flexible substrate and a buffer layer in (Continued)

a drive layer, so that the adhesion force between the flexible substrate and the buffer layer is greatly enhanced by means of chemical adsorption.

15 Claims, 6 Drawing Sheets

(51) Int. Cl.
 *H10K 59/80* (2023.01)
 *H10K 71/00* (2023.01)
 *H10K 59/12* (2023.01)
(52) U.S. Cl.
 CPC ............. *H10K 71/00* (2023.02); *H10K 59/12* (2023.02); *H10K 59/1201* (2023.02)

(56) References Cited

U.S. PATENT DOCUMENTS

| | | | |
|---|---|---|---|
| 2006/0128826 A1* | 6/2006 | Ellison | C09D 181/02 |
| | | | 522/127 |
| 2006/0132461 A1* | 6/2006 | Furukawa | H10K 71/80 |
| | | | 345/173 |
| 2010/0013745 A1 | 1/2010 | Kim et al. | |
| 2011/0062603 A1* | 3/2011 | Hawker | H10K 50/841 |
| | | | 257/E23.116 |
| 2012/0118478 A1 | 5/2012 | Park et al. | |
| 2014/0166995 A1 | 6/2014 | Lee et al. | |
| 2014/0175463 A1* | 6/2014 | Nam | H10K 59/126 |
| | | | 438/28 |
| 2015/0303389 A1* | 10/2015 | Kim | H10K 77/111 |
| | | | 156/60 |
| 2015/0314326 A1 | 11/2015 | Park et al. | |
| 2016/0197292 A1 | 7/2016 | Lee et al. | |
| 2016/0211350 A1* | 7/2016 | Koo | H01L 29/66757 |
| 2019/0067408 A1* | 2/2019 | Sun | G06V 10/147 |
| 2020/0142273 A1* | 5/2020 | Barile | C03C 4/14 |
| 2020/0273764 A1* | 8/2020 | Chen | C09D 5/00 |

FOREIGN PATENT DOCUMENTS

| | | | |
|---|---|---|---|
| CN | 103887322 | | 6/2014 |
| CN | 104022123 | | 9/2014 |
| CN | 104903947 | | 9/2015 |
| CN | 105431893 | | 3/2016 |
| CN | 103779390 | * | 8/2016 |
| CN | 108336143 | | 7/2018 |
| CN | 108425104 | | 8/2018 |
| CN | 108493198 | | 9/2018 |
| WO | WO 2020/133682 | | 7/2020 |

* cited by examiner

DISPLAY PANEL AND MANUFACTURING METHOD THEREOF

RELATED APPLICATIONS

This application is a National Phase of PCT Patent Application No. PCT/CN2019/076829 having International filing date of Mar. 4, 2019, which claims the benefit of priority of Chinese Patent Application No. 201811579228.5 filed on Dec. 24, 2018. The contents of the above applications are all incorporated by reference as if fully set forth herein in their entirety.

FIELD AND BACKGROUND OF THE INVENTION

The present disclosure relates to a display panel and a manufacturing method thereof.

At present, a flat panel display includes a liquid crystal display (LCD), a plasma display panel, an organic light emitting diode (OLED) display device, and the like. The OLED display device has the characteristics of low power consumption, high contrast ratio, wide viewing angle, lightness, flexibility, and the like. The OLED display devices with the large size and the small and medium size in the market become a kind of next-generation mainstream display technology.

The OLED display device is an active light-emitting device, and the thickness of the OLED display device is less than 0.2 µm, such that ultrathin flexible display device can be realized by selecting the substrate with proper thickness and material, which is one of the important advantages of the OLED display device to distinguish from other kinds of display devices. However, a substrate used by an OLED display device on the market is a substrate of glass material. Since the flexible OLED display device still has some problems, the flexible OLED display device is particularly applied to display devices with the large size. An important reason of the application fields is the development of a flexible substrate that is stable and easy to peel off.

A manufacturing method of the traditional flexible display device includes following steps. A flexible substrate is adhered to a hard layer by an adhesive, and a series of manufacturing steps is carried out on the flexible substrate to obtain a flexible display device. However, such a flexible substrate, e.g., polyacetamide, is easy to separate from a driving layer in the subsequent manufacturing process, thereby causing the problems and the product quality of the display devices.

SUMMARY OF THE INVENTION

The present disclosure aims to provide a display panel that includes a flexible substrate, a transition layer, a buffer layer, a driving layer, a functional layer, and a thin film packaging layer. The transition layer covers a side of the flexible substrate. The buffer layer covers a side, away from the hard layer, of the transition layer. The driving layer covers a side, away from the transition layer, of the buffer layer. The functional layer covers a side, away from the buffer layer, of the driving layer. The thin film packaging layer covers surface of the functional layer.

In an embodiment, the transition layer comprises organic molecules having sulfydryl.

In an embodiment, material of the flexible substrate is selected from a group consisting of polyimide, diphenyl ether resin, and polyethylene naphthalate.

In an embodiment, the buffer layer comprises titanium dioxide or silicon dioxide.

In an embodiment, the thickness of the buffer layer ranges from 0.5 to 500 microns.

In another embodiment, the present disclosure aims to provide a manufacturing method of a display panel, comprising steps of: coating a layer of organic polymer on a upper surface of a hard layer, wherein the organic polymer is dried to form a flexible substrate; placing a flexible substrate in a sulfydryl-containing organic solution, wherein after the flexible substrate is taken out, the organic solution is dried to form a transition layer; forming a buffer layer on a upper surface of the transition layer; forming a driving layer on a upper surface of the buffer layer; forming a functional layer on a upper surface of the driving layer; and coating a thin film packaging layer on a upper surface of the functional layer.

In an embodiment, the step of placing the flexible substrate in the sulfydryl-containing organic solution comprises: time for placing the flexible substrate in the organic solution is 5 to 30 minutes; temperature of the organic solution is 20 to 50 degrees Celsius; pH value of the organic solution is 2 to 8; and time for drying the organic solution is 15 to 30 minutes.

In an embodiment, the organic solution is selected from a group consisting of 2-mercaptopropionic acid, mercaptopropionic acid, and 3-mercaptobutyric acid.

In an embodiment, the driving layer is selected from a group consisting of a low-temperature polycrystalline silicon thin film transistor, a thin film transistor, and an oxide thin film transistor.

In an embodiment, the step of coating the thin film packaging layer on the upper surface of the functional layer comprises a chemical vaporization deposition method, an atomic layer deposition method, or an ink-jet printing method.

The present disclosure provides a chemical adjustment method. A sulfydryl-containing transition layer 102 is modified on the flexible substrate by using a sulfydryl-modified method, and is used for tightly adhering the flexible substrate and the buffer layers 103 of the driving layer 104. The adhesive force between the flexible substrate and the buffer layer 103 is greatly enhanced by chemical adsorption, such that the phenomenon separating the flexible substrate from the driving layer 104 in the process of vaporization of the substrate or during a later use process can be effectively avoided, and the product quality and the yield rate are improved.

BRIEF DESCRIPTION OF THE SEVERAL VIEWS OF THE DRAWINGS

The following embodiments refer to the accompanying drawings for exemplifying specific implementable embodiments of the present disclosure in a suitable computing environment. It should be noted that the exemplary described embodiments are configured to describe and understand the present disclosure, but the present disclosure is not limited thereto.

DESCRIPTION OF SPECIFIC EMBODIMENTS OF THE INVENTION

Directional terms, such as an upper side, a lower side, a front side, a back side, a left side, a right side, an inner side, an outer side, and a lateral side, mentioned in the present disclosure are only for reference. Therefore, the directional terms are used for describing and understanding rather than limiting the present disclosure. In the figures, units having similar structures are used for the same reference numbers.

Embodiments of the present disclosure will be described in detail with reference to the accompanying drawings. The present disclosure can be embodied in many different forms and should not be construed as limited to the specific embodiments set forth herein. The embodiment of the present disclosure is used for explaining the practical application of the disclosure, so that other technicians in the art can understand various embodiments of the present disclosure and various modification schemes suitable for specific expected applications.

Figure 1:
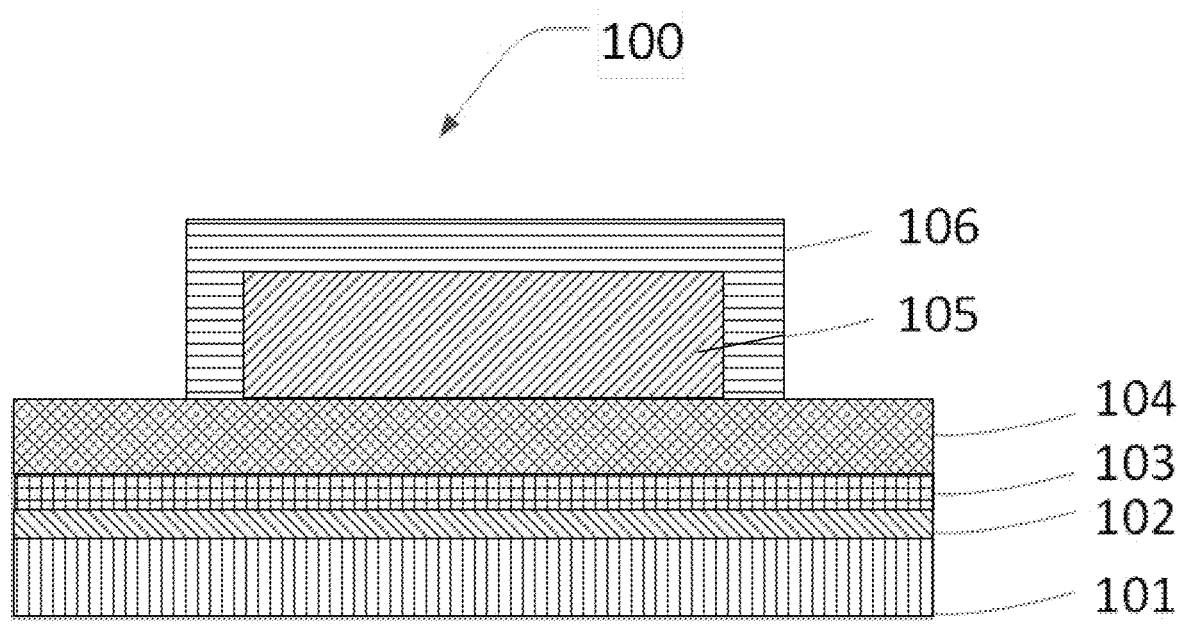
FIG. 1 is a schematic structural diagram of a display panel according to an embodiment of the present disclosure.

As shown in FIG. 1, the present disclosure provides a display panel 100 including a flexible substrate 101, a transition layer 102, a buffer layer 103, a driving layer 104, a functional layer 105, and a thin film packaging layer 106.

The material of the flexible substrate 101 includes, but is not limited to, polyimide, diphenyl ether resin, or polyethylene naphthalate.

The transition layer 102 is configured to cover a side of a hard plate, and the transition layer 102 is an organic molecule containing sulfydryl. The transition layer 102 is formed by reacting an organic solution with the organic polymer on the flexible substrate 101. The organic solution includes, but not limited to, 2-mercaptopropionic acid, mercaptopropionic acid, or 3-mercaptobutyric acid, where the chemical modification speed and uniformity can be controlled through the temperature and the pH value, such that the adhesive force of the transition layer 102 and the flexible substrate 101 can be increased.

The buffer layer 103 is configured to cover a side, away from a hard layer, of the transition layer 102, and the buffer layer 103 is formed on the surface of the transition layer 102 by a chemical vaporization deposition (CVD) method or an atomic layer deposition (ALD) method. In an embodiment, the buffer layer 103 is made of $TiO_2$, $SiO_2$, and the thickness of the buffer layer 103 ranges from 0.5 μm to 500 μm. In other embodiments, the thickness of the buffer layer 103 can be 10 μm, 50 μm, 100 μm, 250 nm or 400 nm, and is preferably 100 nm.

The driving layer 104 is configured to cover a side, away from the transition layer 102, of the buffer layer 103. The driving layer 104 is a low-temperature polycrystalline silicon thin film transistor (LTPS-TFT), a thin film transistor (TFT), or an oxide thin film transistor. In an embodiment, the driving layer 104 is used to drive a panel to display.

The functional layer 105 is configured to cover a side, away from the buffer layer 103, of the driving layer 104. The functional layer 105 can be an OLED display device including an anode, a hole injection layer, a hole transmission layer, a light-emitting electron transmission layer, an electron injection layer, and a cathode. The anode is coated on a side, away from the buffer layer 103, of the driving layer 104. The hole injection layer is configured to a side, away from the driving layer 104, of the anode. The hole transport layer is configured to cover a side, away from the anode side, of the hole injection layer. The light-emitting layer is configured to cover a side, away from the hole injection layer, of the hole transport layer. The electron transmission layer is configured to cover a side, away from the hole transmission layer, of the light-emitting layer. The electron injection layer is configured to cover a side, away from the light-emitting layer, of the electron transmission layer. The cathode is coated on a side, away from the electron transmission layer, of the electron injection layer. In other embodiments, the functional layer 105 can also be a liquid crystal display structure of an LCD, such that the imaging effect of the pixels of the display panel is achieved.

The thin film packaging layer 106 is configured to cover the surface of the functional layer 105. The manufacturing method of the thin film packaging layer 106 can be a chemical vaporization deposition method, an atomic layer deposition method or an ink-jet printing method, and the method is preferably a chemical vaporization deposition method. The thin film packaging layer mainly plays roles of isolating water and oxygen and can be used for protecting related devices of the functional layer 105.

Figure 2:
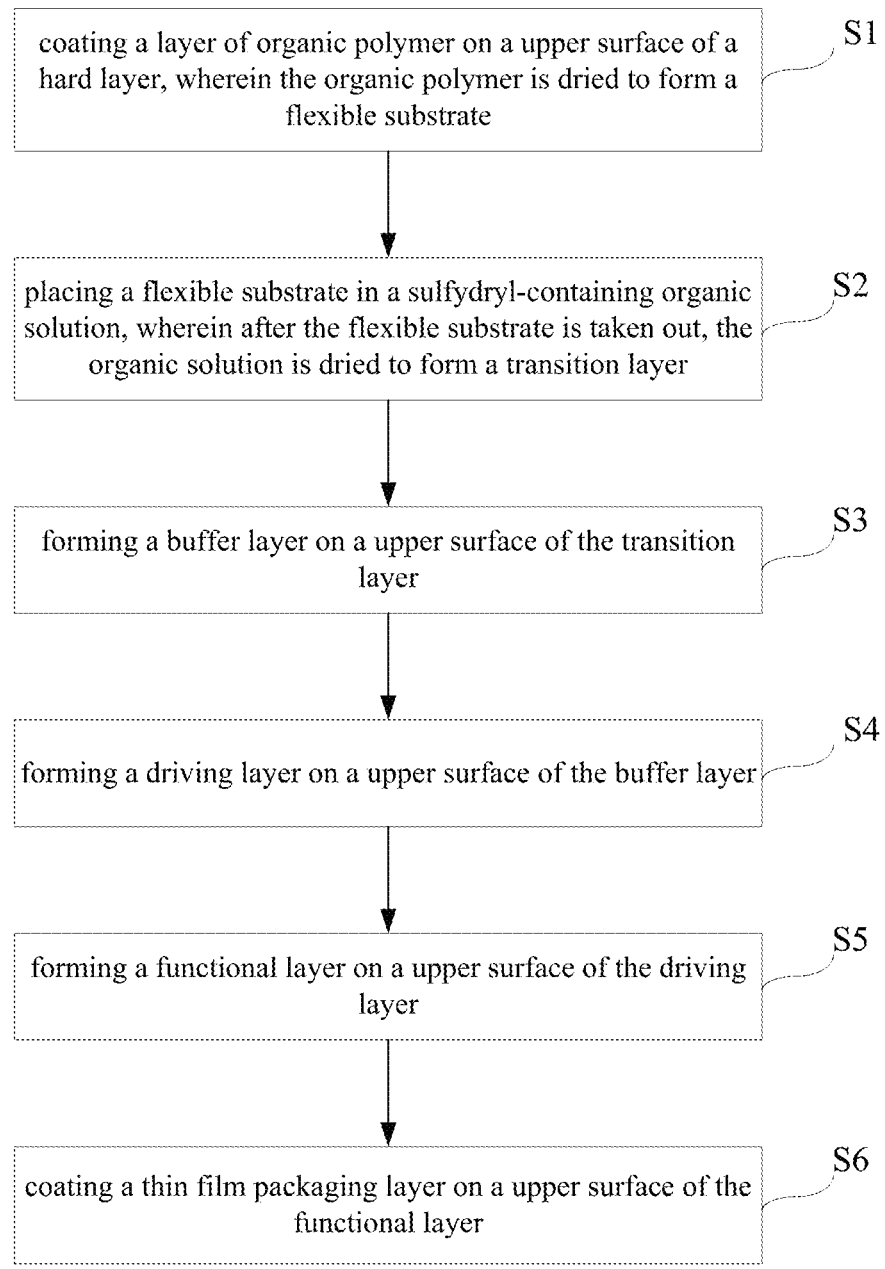
FIG. 2 is a flowchart of a manufacturing method of a display panel according to an embodiment of the present disclosure.

As shown in FIG. 2, the present disclosure further provides a manufacturing method of the display panel 100, including the following steps S1 to S6.

Figure 3:
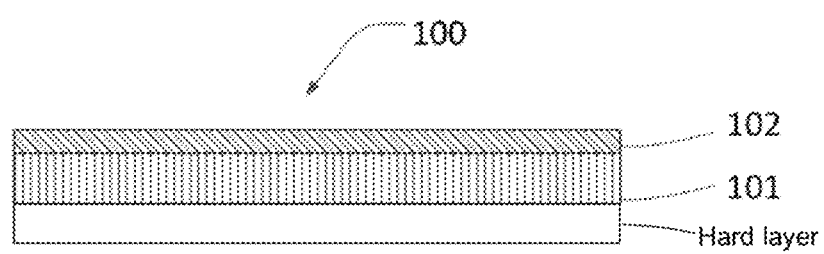
FIG. 3 is a schematic structural diagram of a flexible substrate and a transition layer according to an embodiment of the present disclosure.

At step S1, as shown in FIG. 3, an organic polymer is coated on the upper surface of the hard layer, and the organic polymer is dried to form a flexible substrate 101. The hard layer is glass or hard resin, and the organic polymer is selected from a group consisting of polyimide, diphenyl ether resin, and polyethylene naphthalate.

At step S2, the flexible substrate 101 is placed in a sulfydryl-containing organic solution, and after the flexible substrate 101 is taken out, the organic solution is dried to form a transition layer 102 on the flexible substrate 101. The flexible substrate 101 is placed for 5 to 30 minutes, preferably 20 minutes. In other embodiments, the time for placing the flexible substrate 101 can also be 10 minutes, 15 minutes, or 25 minutes. The time for placing the flexible substrate 101 in the organic solution is from 20 to 50 degrees Celsius and preferably 30 degrees Celsius, and can also be 25 degrees Celsius or 40 degrees Celsius in other embodiments, where the pH value of the organic solution is from 2 to 8, preferably, the pH value is 5, and the pH value can be 3, 4, or 6 in other embodiments. The drying time of the organic solution is from 15 to 30 minutes, preferably 25 minutes, and can also be 20 minutes, 24 minutes or 28 minutes in other embodiments.

The transition layer 102 is manufactured by reacting an organic solution with the organic polymer of the flexible substrate 101 to form the transition layer 102.

The organic solution includes, but not limited to, 2-mercaptopropionic acid, mercaptopropionic acid, or 3-mercaptobutyric acid, where the chemical modification speed and uniformity can be controlled through the temperature and the pH value, such that the adhesive force of the transition layer 102 and the flexible substrate 101 can be increased.

Figure 4:
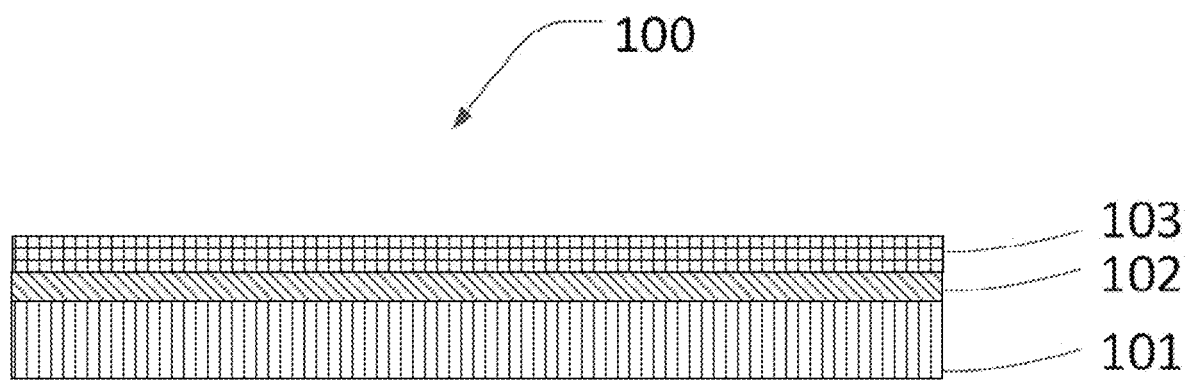
FIG. 4 is a schematic structural diagram of a flexible substrate, a transition layer, and a buffer layer according to an embodiment of the present disclosure.

At step S3, as shown in FIG. 4, a buffer layer 103 is formed on the upper surface of the transition layer 102, and the buffer layer 103 is formed on the surface of the transition layer 102 by a chemical vaporization deposition (CVD) method or an atomic layer deposition (ALD) method. In an embodiment, the buffer layer 103 is made of $TiO_2$, $SiO_2$, and the thickness of the buffer layer 103 ranges from 0.5 μm to 500 μm. In other embodiments, the thickness of the buffer layer 103 can be 10 μm, 50 μm, 100 μm, 250 nm or 400 nm, and is preferably 100 nm.

Figure 5:
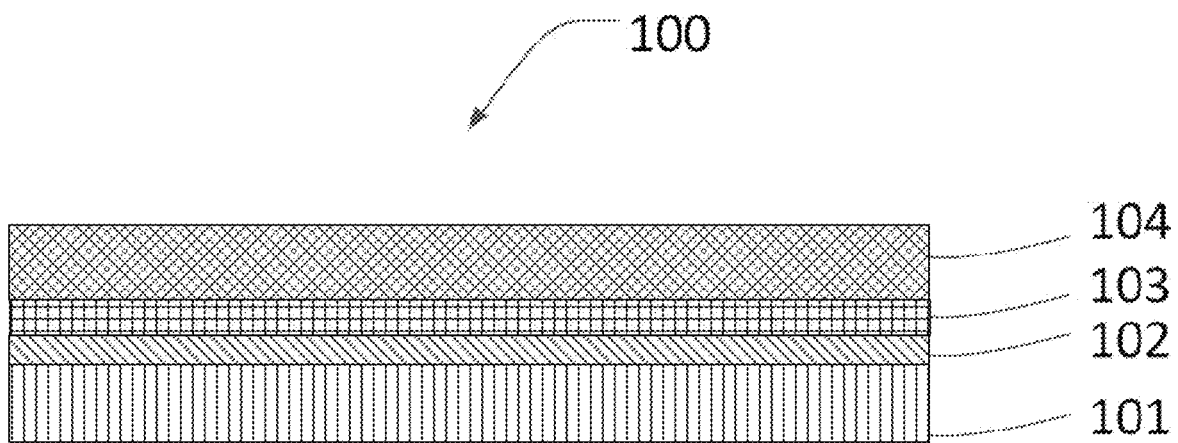
FIG. 5 is a schematic structural diagram of a flexible substrate, a transition layer, a buffer layer, and a driving layer according to an embodiment of the present disclosure.

At step S4, as shown in FIG. 5, a driving layer 104 is formed on the upper surface of the buffer layer 103. The driving layer 104 is a low-temperature polycrystalline silicon thin film transistor (LTPS-TFT), a thin film transistor (TFT), or an oxide thin film transistor. In an embodiment, the driving layer 104 is used to drive a panel to display.

Figure 6:
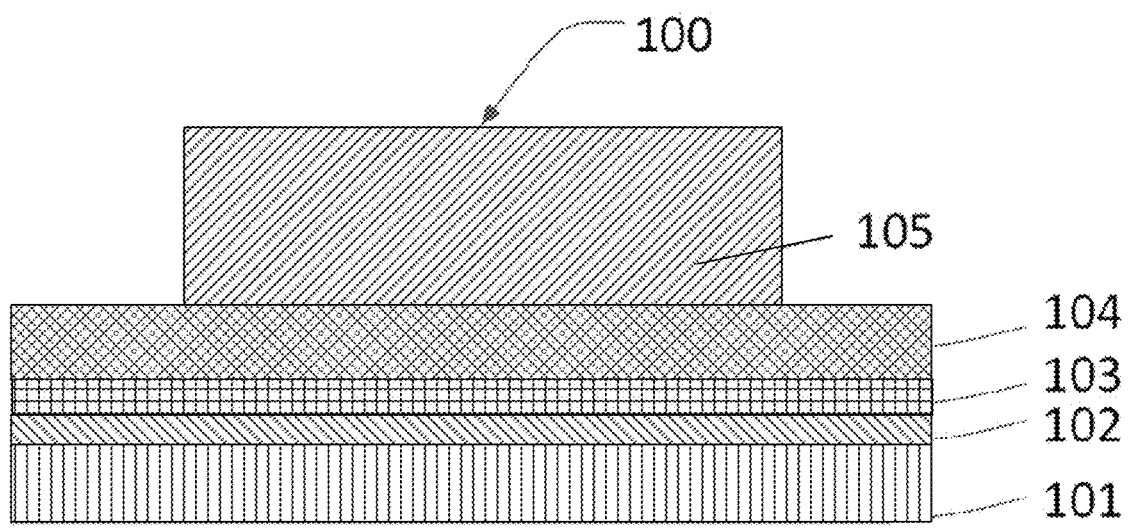
FIG. 6 is a schematic cross-sectional diagram of a flexible substrate, a transition layer, a buffer layer, a driving layer, and a functional layer according to an embodiment of the present disclosure.

At step S5, as shown in FIG. 6, a functional layer 105 is formed on a upper surface of the driving layer 104. The functional layer 105 can be an OLED display device including an anode, a hole injection layer, a hole transmission layer, a light-emitting electron transmission layer, an electron injection layer, and a cathode. The anode is coated on a side, away from the buffer layer 103, of the driving layer 104. The hole injection layer is configured to a side, away from the driving layer 104, of the anode. The hole transport layer is configured to cover a side, away from the anode side, of the hole injection layer. The light-emitting layer is configured to cover a side, away from the hole injection layer, of the hole transport layer. The electron transmission layer is configured to cover a side, away from the hole transmission layer, of the light-emitting layer. The electron injection layer is configured to cover a side, away from the light-emitting layer, of the electron transmission layer. The cathode is coated on a side, away from the electron transmission layer, of the electron injection layer. In other embodiments, the functional layer 105 can also be a liquid crystal display structure of an LCD, such that the imaging effect of the pixels of the display panel is achieved.

At step S6, a thin film packaging layer 106 is coated on the upper surface of the functional layer 105. The manufacturing method of the thin film packaging layer 106 can be a chemical vaporization deposition method, an atomic layer deposition method or an ink-jet printing method, and the method is preferably a chemical vaporization deposition method. The thin film packaging layer mainly plays roles of isolating water and oxygen and can be used for protecting related devices of the functional layer 105.

The present disclosure provides a chemical adjustment method. A sulfydryl-containing transition layer 102 is modified on the flexible substrate by using a sulfydryl-modified method, and is used for tightly adhering the flexible substrate and the buffer layers 103 of the driving layer 104. The adhesive force between the flexible substrate and the buffer layer 103 is greatly enhanced by chemical adsorption, such that the phenomenon separating the flexible substrate from the driving layer 104 in the process of vaporization of the substrate or during a later use process can be effectively avoided, and the product quality and the yield rate are improved.

As is understood by a person skilled in the art, the foregoing preferred embodiments of the present disclosure are illustrative rather than limiting of the present disclosure. It is intended that they cover various modifications and similar arrangements be included within the spirit and scope of the present disclosure, the scope of which should be accorded the broadest interpretation so as to encompass all such modifications and similar structures.

What is claimed is:

1. A manufacturing method of a display panel, comprising steps of:

coating a layer of organic polymer on an upper surface of a hard layer, wherein the organic polymer is dried to form a flexible substrate;

placing a flexible substrate in a sulfydryl-containing organic solution, wherein after the flexible substrate is taken out, the organic solution is dried to form a transition layer to be in direct contact with the flexible substrate;

forming a buffer layer on an upper surface of the transition layer, wherein the buffer layer is in direct contact with the upper surface of the transition layer;

forming a driving layer on an upper surface of the buffer layer;

forming a functional layer on an upper surface of the driving layer; and coating a thin film packaging layer on an upper surface of the functional layer, wherein the organic solution is selected from a group consisting of 2-mercaptopropionic acid, mercaptopropionic acid, and 3-mercaptobutyric acid, and the buffer layer comprises titanium dioxide or silicon dioxide, and wherein material of the flexible substrate is selected from a group consisting of polyimide, diphenyl ether resin, and polyethylene naphthalate.

2. The display panel manufacturing method according to claim 1, wherein the step of placing the flexible substrate in the sulfydryl-containing organic solution comprises:

time for placing the flexible substrate in the organic solution is 5 to 30 minutes;

temperature of the organic solution is 20 to 50 degrees Celsius;

pH value of the organic solution is 2 to 8; and time for drying the organic solution is 15 to 30 minutes.

3. The display panel manufacturing method according to claim 1, wherein the driving layer is selected from a group consisting of a low-temperature polycrystalline silicon thin film transistor, a thin film transistor, and an oxide thin film transistor.

4. The display panel manufacturing method according to claim 1, wherein the step of coating the thin film packaging layer on the upper surface of the functional layer comprises a chemical vaporization deposition method, an atomic layer deposition method, or an ink-jet printing method.

5. The display panel manufacturing method according to claim 1, wherein the hard layer is glass or hard resin.

6. The display panel manufacturing method according to claim 1, wherein the organic polymer is selected from a group consisting of polyimide, diphenyl ether resin, and polyethylene naphthalate.

7. The display panel manufacturing method according to claim 1, wherein the forming of the buffer layer on the upper surface of the transition layer comprises:

forming the buffer layer on the upper surface of the transition layer by a chemical vaporization deposition (CVD) method or an atomic layer deposition (ALD) method.

8. The display panel manufacturing method according to claim 1, wherein the buffer layer is made of at least one of $TiO_2$ and $SiO_2$.

9. The display panel manufacturing method according to claim 1, wherein a thickness of the buffer layer ranges from 0.5 μm to 500 μm.

10. The display panel manufacturing method according to claim 9, wherein the thickness of the buffer layer is 10 μm, 50 μm, 100 μm, 250 μm or 400 μm.

11. The display panel manufacturing method according to claim 1, wherein the functional layer can be an OLED display device including an anode, a hole injection layer, a hole transmission layer, a light-emitting electron transmission layer, an electron injection layer, and a cathode.

12. The display panel manufacturing method according to claim 2, wherein the time for placing the flexible substrate in the organic solution is 10 minutes, 15 minutes, or 25 minutes.

13. The display panel manufacturing method according to claim 2, wherein the temperature of the organic solution is 25 degrees Celsius, 30 degrees Celsius, or 40 degrees Celsius s.

14. The display panel manufacturing method according to claim 2, wherein the pH value of the organic solution is 3, 4, 5, or 6.

15. The display panel manufacturing method according to claim 2, wherein the time for drying the organic solution is 20 minutes, 24 minutes, 25 minutes, or 28 minutes.

* * * * *